Figure 3A:
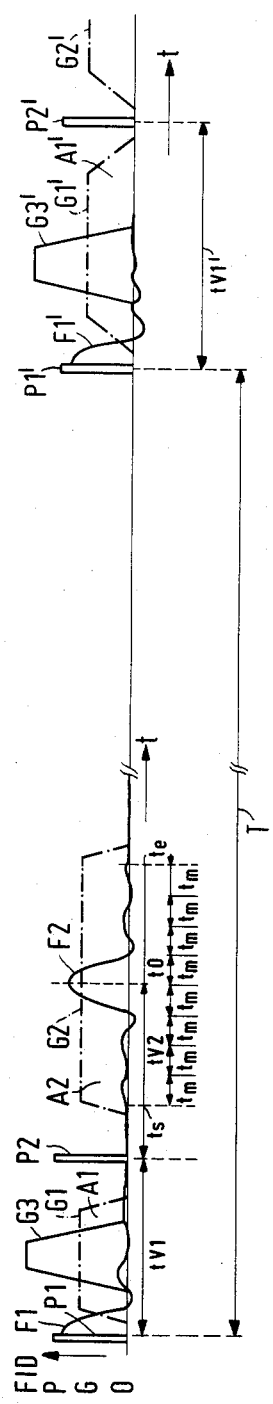

United States Patent [19]
van Uijen et al.

[11] Patent Number: 4,621,235
[45] Date of Patent: Nov. 4, 1986

[54] METHOD OF AND DEVICE FOR DETERMINING A NUCLEAR MAGNETIZATION DISTRIBUTION IN A REGION OF A BODY

[75] Inventors: Cornelis M. J. van Uijen; Johannes H. den Boef, both of Eindhoven, Netherlands

[73] Assignee: U.S. Philips Corporation, New York, N.Y.

[21] Appl. No.: 614,001

[22] Filed: May 25, 1984

[30] Foreign Application Priority Data

Jun. 7, 1983 [NL] Netherlands ............... 8302017
Mar. 29, 1984 [NL] Netherlands ............... 8400991

[51] Int. Cl.$^4$ .................................. G01R 33/20
[52] U.S. Cl. ...................... 324/307; 324/311; 324/309
[58] Field of Search ............ 324/300, 307, 309, 311

[56] References Cited

U.S. PATENT DOCUMENTS 4,471,306 9/1984 Edelstein ............... 324/311

Primary Examiner—Michael J. Tokar
Attorney, Agent, or Firm—Robert T. Mayer; Algy Tamoshunas

[57] ABSTRACT

During measurement cycles for generating and sampling FID signals in NMR imaging devices, a 180° pulse and subsequently a 90° excitation pulse are added to the pulse sequence. The 180° pulse produces an additional echo signal. During (the maximum of) the echo signal, the 90° pulse is generated. The waiting period occurring before the beginning of a next measurement cycle can thus be substantially reduced without giving rise to a significant signal loss in the echo signals to be generated during said cycle. In addition to a reduction of the measurement time, NMR images with different contrasts (other intensity distribution) can be provided.

15 Claims, 7 Drawing Figures

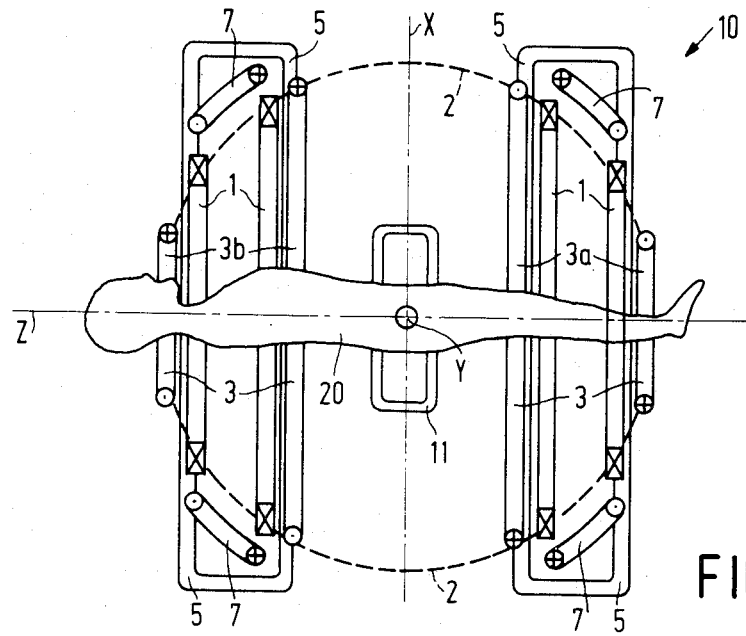
FIG. 1
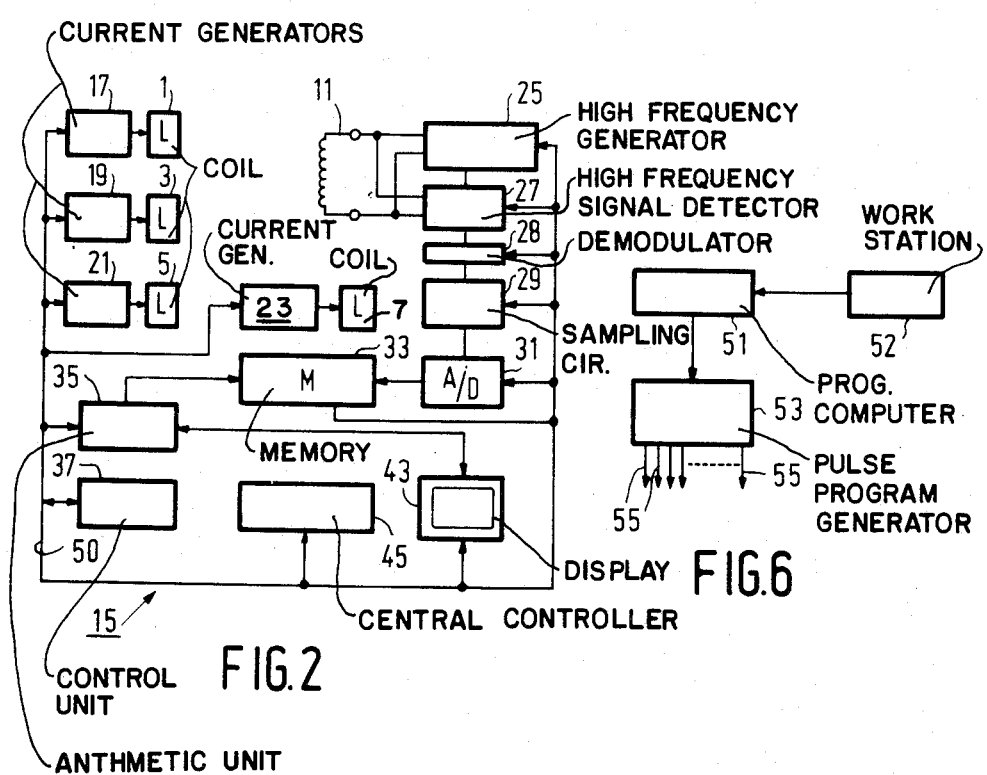
FIG. 2
FIG. 6

METHOD OF AND DEVICE FOR DETERMINING A NUCLEAR MAGNETIZATION DISTRIBUTION IN A REGION OF A BODY

The invention relates to a method of determining a nuclear magnetization distribution in a region of a body, a steady, homogeneous magnetic field being generated in which the region of the body is situated, and (a) a high-frequency electromagnetic pulse is generated in order to cause a precessional motion of the magnetization of nuclei in the body, thus generating a resonance signal, (b) after which, after a preparation period, a number of signal samples is periodically extracted from the resonance signal during a measurement period which is divided into a number of sampling intervals, (c) after which, each time after a waiting period, the steps (a) and (b) are repeated a number of times (n') in order to obtain a group of (n×n') signal samples wherefrom an image of the distribution of the induced nuclear magnetization is determined.

The invention also relates to a device for determining the nuclear magnetization distribution in a region of a body, comprising (a) means for generating a steady homogeneous magnetic field, (b) means for generating high-frequency electromagnetic radiation, (c) means for generating a gradient magnetic field, (d) sampling means for sampling a resonance signal generated by the means specified sub (a) and (b), (e) processing means for processing the signals provided by the sampling means in order to form a nuclear magnetization distribution, and (f) control means for controlling at least the means specified sub (b) to (e) for generating, conditioning, sampling and processing a plurality of resonance signals.

A similar method (also referred to as Fourier zeugmatography) and device are known from U.S. Pat. No. 4,070,611. According to such a method, a body to be examined is subjected to a strong, steady, homogeneous magnetic field Bo whose field direction coincides with, for example, the z-axis of a cartesian coordinate system (x, y, z). The steady magnetic field Bo produces a slight polarization of the nuclear spins present in the body and enables a precessional motion of nuclear spins to occur about the direction of the magnetic field Bo. After the application of a magnetic field Bo, a preferably 90° pulse of high-frequency electromagnetic radiation is generated (with an angular frequency $\omega = \gamma \cdot Bo$, in which $\gamma$ is the gyromagnetic ratio and Bo is the intensity of the magnetic field) which rotates the magnetization direction of nuclei present in the body through an angle (90°). After termination of the 90° pulse, the nuclear spins will start to perform a precessional motion about the field direction of the magnetic field Bo, thus generating a resonance signal (FID signal). Using the gradient magnetic fields $G_x$, $G_y$, $G_z$ whose field direction coincides with that of the magnetic field Bo, a total magnetic field $$B = Bo + G_x \cdot x + G_y \cdot y + G_z \cdot z$$

can be generated whose intensity is location-dependent, because the intensity of the gradient magnetic fields $G_x$, $G_y$, $G_z$ has a gradient in the x, the y and the z direction, respectively.

After the 90° pulse, a field $G_x$ is applied for a period $t_x$ and subsequently a field $G_y$ for a period $t_y$, so that the precessional motion of the excited nuclear spins is influenced in a location-dependent manner. After this preparation period (i.e. after $t_x + t_y$), a field $G_z$ is applied and the FID signal (actually the sum of all magnetizations of the nuclei) is repeated $1 \times m$ times at $N_z$ measurement instants during a measurement period $t_z$, each time different values being used for $t_x$ and/or $t_y$. Thus, ($N_z \times m \times 1$) signal samples are obtained which contain the information concerning the magnetization distribution in a region of the body in the x, y, z space. The $1 \times m$ measured sets of $N_z$ signal samples are stored in a memory (in $N_z \times m \times 1$) memory locations, after which an image of the nuclear magnetization distribution is obtained by 3-D Fourier transformation of the sampled values of the FID signals.

It will be apparent that it is alternatively possible, using selective excitation, to generate the FID signal of nuclear spins only in a 2-dimensional slice (having an orientation which can be selected at random) so that, for example, an FID signal need only be generated m times in order to obtain an image of the magnetization distribution in $m \times N_2$ points in the selected slice by means of a 2-dimensional Fourier transformation. It will be apparent from the foregoing that when use is made of the Fourier Zeugmatography method, the time required for forming an image of the magnetization distribution may be as much as at least a few minutes. Such a measurement period is unacceptably long for a patient being examined who must remain motionless during this period.

It is an object of the invention to provide a method and a device which substantially reduce the time required to form an image of a nuclear magnetization distribution with a resolution which at least equals that obtained when use is made of the present state of the art, for example in Fourier Zeugmatography.

It is a further object of the invention to provide a method and device which enable the imaging of a nuclear magnetization distribution to be carried out with a different intensity distribution with respect to the images formed by means of the pulse sequences used in the state of the art.

To this end, a method in accordance with the invention is characterized in that, after the sampling of the resonance signal, a high-frequency 180° pulse is generated in order to generate a nuclear spin echo signal and an effect (phase shift) exerted on the nuclear magnetization by a gradient field is cancelled, after which a further high-frequency excitation pulse is generated during the nuclear spin echo signal.

As a result of the use of the further high-frequency excitation pulse, the measurement cycles can succeed one another more rapidly without seriously affecting the signal intensity of a nuclear spin resonance signal in successive measurement cycles. A slight, insignificant signal loss will occur, but the resonance signals generated will contain other information which will lead to a different intensity distribution in an image. The use of the further high-frequency excitation pulses, consequently, not only results in a shorter measurement cycle but also produces additional image information which will depend on the period of time expiring between the successive pulses.

The further high-frequency excitation pulse offers the desired result notably when the effects of (phase shift due to) field inhomogeneities (of the steady uniform main field; Bo field) and of the gradient magnetic fields which have been activated or of other deliberately introduced inhomogeneities have been cancelled.

In the present method the waiting period between the further high-frequency excitation pulse and the beginning of a next measurement cycle is of the same order of magnitude as the period of time expiring between the high-frequency 180° pulse and the further high-frequency excitation pulse. This means that the total period of time needed for taking a number of samples required for an N.M.R image (without significant signal loss) will be a factor of from 3 to 10 times shorter than the period of time required according to the present state of the art.

Using the method in accordance with the invention, for example, a nuclear spin density distribution is measured in a slice of a body by applying a first gradient field after selective excitation of said slice during the preparation period (in accordance with the known state of the art) and by applying during the measurement period, a different gradient field whose gradient direction extends transversely with respect to the gradient direction of the first gradient field. Using the method in accordance with the invention, it is alternatively possible to determine location-dependent nuclear spin resonance spectra (location-dependent nuclear spin spectroscopy) if, contrary to the known determination of a nuclear spin density distribution, no (steady) gradient field is applied during the measurement period. For example, by using selective excitation and the application of two gradient fields (with two transversely directed gradient directions in the plane of excitation), the proposed invention enables determination of a frequency spectrum (chemical shifts) of the nuclear spin resonances present per pixel in said slice. The number of pixels in the slice can be chosen in accordance with the state of the art.

As has already been stated, the precessional frequency of the nuclear magnetization M is determined by $\omega = \gamma \cdot B$. The gyromagnetic ratio $\gamma$ depends only on the type of nucleus for as long as the nucleus can be considered to be "free". Usually, the nuclei cannot be considered to be free, because they are inter alia influenced by binding electrons around the nucleus. This becomes manifest as a so-called chemical shift $\sigma$; the bound nucleus does not resonate at $\omega = \gamma \cdot B$, but rather at $\omega' = \gamma \cdot B \cdot (1 - \sigma)$. The angular frequency $\omega'$ as well as the detuning $\Delta \omega = \omega - \omega' = \gamma \cdot B \cdot \sigma$ are proportional to the magnetic field B. Generally, $\sigma$ is very small (in the order of magnitude of from $10^{-6}$ to $10^{-4}$). When the intensity of the magnetic field B is sufficient, for example higher than 1T, different peaks can be distinguished in a generated spectrum due to the different values of $\sigma$, said peaks being associated with nuclei which each have a different chemical bond. For example, in the spectrum of phosphor (31P) in biological matter peaks can be distinguished which are associated with phosphorcreatine, ATP and an organically bound phosphor (see, for example "Localized measurements of metabolism by NMR methods", by R. L. Nunnally, in the Proceedings of an International Symposium on N.M.R., Bowman-Gray School of Medicine of Wake Forest University, Winston-Salem, N.C., Oct. 1–3, 1981, pages 181–184). The mutual relationships of the magnitude of these peaks contains information as regards the metabolic condition of the tissue. It has been found to be useful to chart such spectra as a function of the location in the tissue or in a part of the body to be examined. For this purpose use can be made of the method and device disclosed in U.S. Pat. No. 4,070,611 if no gradient field is activated during the measurement period (so during the sampling of the resonance signal).

The foregoing will be illustrated on the basis of an example where the spectra are determined as a function of two location coordinates (for example, x, y). During a first step, a slice having a thickness $\Delta z$ (transversely with respect to the z-axis) is excited by way of selective excitation. Subsequently, the x and/or y gradient fields are activated during the preparation period. During the measurement period, the generated resonance signal is sampled.

Consequently, no gradient field is activated during the measurement period, so that the resonance signal to be measured is a function of image frequencies $k_x$, $k_y$ and of the time t. The image frequencies $k_x$, $k_y$ are determined by the gradient fields $G_x$ and $G_y$ applied during the preparation period, as will be explained hereinafter. When the measurement cycle is repeated a large number of times with each time gradient fields $G_x$ and $G_y$ of different intensity and/or different duration activated during the preparation time, a series of signal samples of resonant signals will be extracted as a function of the time for each different image frequency pair $(k_x, k_y)$. Thus, a three-dimensional matrix $(k_x, k_y, t)$ is filled with signal samples. After a 3-D Fourier transformation (to t, to $k_x$ and to $k_y$), from the three-dimensional data matrix $(k_x, k_y, t)$ a frequency spectrum is found at points (x, y) in the (selectively excited) two-dimensional x-y plane. The described method can be very simple extended from a two-dimensional plane to a volume; after excitation of a given volume three gradient fields are then activated during the preparation period, after which a time signal is measured which is associated with a frequency trio $(k_x, k_y, k_z)$ during sampling (in the absence of gradient fields). By repeating the measurement a large number of times with each time different intensities of the gradient fields ($G_x$, $G_y$, $G_z$ (or other periods of time during which the gradient fields are activated) during the preparation period, a four-dimensional matrix $(k_x, k_y, k_z, t)$ is filled with signal samples. After a 4-D Fourier transformation (to t, to $k_x$, to $k_y$ and to $k_z$) a frequency spectrum is obtained at each point (x, y, z) in said volume. As has already been stated, an object to be examined may not be displaced or moved (or shift or move) during the successive waiting, preparation and measurement periods. The described method in accordance with the invention for the determination of a resonance spectra distribution, substantially reduces the time required for making an image of the local nuclear spin resonance spectra (with a resolution which at least equal that when use is made of the known Fourier zeugmatography technique), which is of course an advantage.

A preferred embodiment of the method in accordance with the invention is characterized in that after the further high-frequency excitation pulse, after a period of time T, a similar cycle of high-frequency pulses with associated gradient magnetic fields is completed, at least one pulse interval gradient magnetic fields is completed, at least one pulse interval during the first cycle then being different from a corresponding pulse interval during the second cycle. When the sampling signals are taken in accordance with the preferred embodiment of the method, it is found that substantial contrast variations are achieved in the image which is ultimately formed. The stationary solution of the Bloch equations reveals that negative signals which produce this contrast increase can occur in the resonance signal during the second cycle.

The device for performing the method in accordance with the invention is characterized in that the control means comprise preprogrammed computer means for generating and supplying control signals to the means for generating high-frequency electromagnetic radiation, said control signals being capable of generating an adjustable pulse sequence of 90° and 180° excitation pulses, a period of time expiring between two 180° excitation pulses last generated being twice as long as the period of time expiring between the last 180° excitation pulse and a subsequent further 90° excitation pulse. The described device thus enables a method in accordance with the invention to be simply performed and, if necessary, adapted to the nature of the object to be examined (for example, when utilizing the variations in contrast in the NMR image).

Figure 3B:
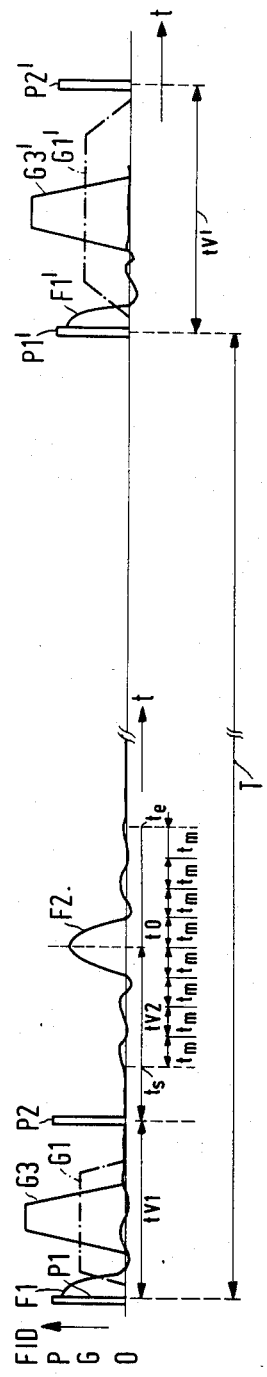
Figure 4:
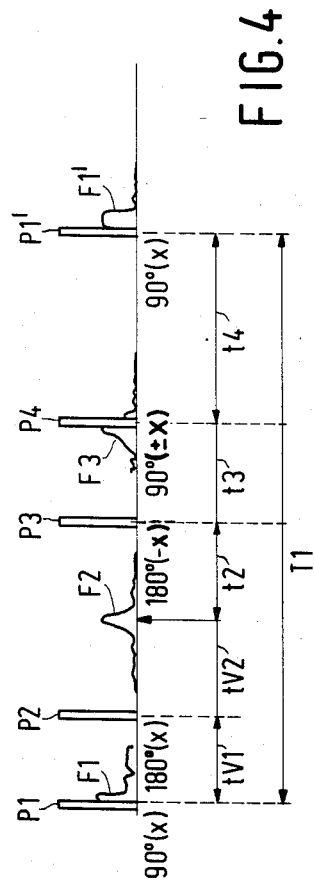
Figure 5:
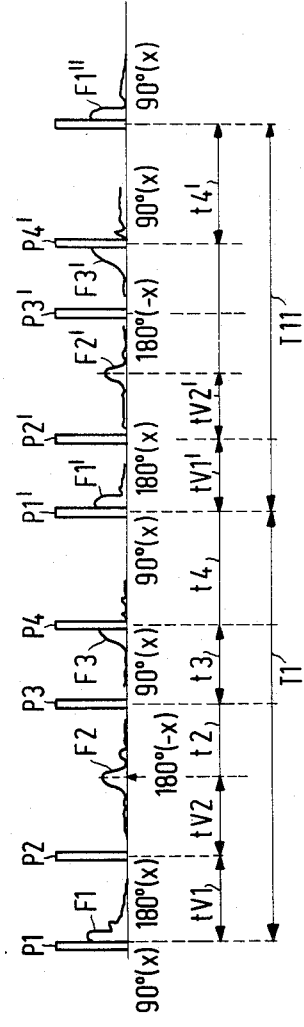

An embodiment in accordance with the invention will now be described, by way of example, with reference to the drawings; therein:

FIG. 1 shows diagrammatically a configuration of a coil system of a device for performing a method in accordance with the invention, FIG. 2 shows a block diagram of a device for performing the method in accordance with the invention, FIGS. 3a and 3b show simple embodiments and methods in accordance with the state of the art, FIG. 4 illustrates a version of a method in accordance with the invention, FIG. 5 illustrates a preferred version of a method in accordance with the invention, and FIG. 6 shows a part of a device for performing the method in accordance with the invention.

FIG. 1 shows a coil system 10 which forms part of a device 15 (FIG. 2) used for determining a nuclear magnetization distribution in a region of a body 20. This region has a thickness of, for example, $\Delta z$ and is situated in the x-y plane of the coordinate system x-y-z shown. The y-axis of the system extends upwards perpendicularly to the plane of drawing. The coil system 10 generates a uniform steady magnetic field Bo having a field direction parallel to the z-axis, three gradient magnetic fields $G_x$, $G_y$ and $G_z$ having a field direction parallel to the z-axis and a gradient direction parallel to the x, y and z axis, respectively, and a high-frequency magnetic field. To achieve this, the coil system 10 comprises a set of main coils 1 for generating the steady magnetic field Bo. The main coils 1 may be arranged, for example, on the surface of a sphere 2 whose centre is situated at the origin O of the Cartesian coordinate system x, y, z shown, the axes of the main coils 1 being coincident with the z axis.

The coil system 10 furthermore comprises four coils 3a, 3b which generate the gradient magnetic field $G_z$. To achieve this, a first set 3a is excited by a current in the opposite sense with respect to the current in the second set 3b; this is denoted by ⊙ and ⊗ in the Figure. Therein, ⊙ means a current entering the section of the coil 3 and ⊗ means a current leaving the section of the coil.

The coil system 10 also comprises four rectangular coils 5 (only two of which are shown) or four other coils such as, for example, "Golay coils" for generating the gradient magnetic field $G_y$. In order to generate the gradient magnetic field $G_x$ use is made of four coils 7 which have the same shape as the coils 5 and which have been rotated through an angle of 90° about the z-axis with respect to the coils 5. FIG. 1 also shows a coil 11 for generating and detecting a high-frequency electromagnetic field.

FIG. 2 shows a device 15 for performing a method in accordance with the invention. The device 15 comprises coils 1, 3, 5, 7 and 11 which have already been described with reference to FIG. 1, current generators 17, 19, 21 and 23 for the excitation of the coils 1, 3, 5 and 7, respectively, and a high-frequency signal generator 25 for the excitation of the coil 11. The device 15 also comprises a high-frequency signal detector 27, a demodulator 28, a sampling circuit 29, processing means such as an analog-to-digital converter 31, a memory 33 and an arithmetic circuit 35 for performing a Fourier transformation, a control unit 37 for controlling the sampling instants, and also a display device 43 and central control means 45 whose functions and relationships will be described in detail hereinafter.

The device 15 performs a method for determining the nuclear magnetization distribution in a region of a body 20 as will be described hereinafter. The method involves the frequent repetition of a measurement cycle which itself can be divided into several steps. During a measurement cycle, a part of the nuclear spins present in the body is resonantly excited. The resonant excitation of the nuclear spins is effected by activation of the current generator 17 by the central control unit 45, so that the coil 1 is energized and remains energized for a desired number of measurement cycles. A steady and uniform magnetic field Bo is thus generated. Furthermore, the high-frequency generator 25 is switched on for a brief period of time, so that the coil 11 generates a high-frequency electromagnetic field (r.f. field). The nuclear spins in the body 20 can be resonantly excited by the applied magnetic fields, the excited nuclear magnetization then enclosing a given angle of, for example, 90° (90° r.f. pulse) with respect to the direction of the uniform magnetic field Bo. Where and which nuclear spins will be excited will depend inter alia on the intensity of the field Bo, on any gradient magnetic field to be applied, and on the angular frequency $\omega_o$ of the high-frequency electromagnetic field, because the equation $\omega_o = \gamma \cdot Bo$ (1) has to be satisfied, in which $\gamma$ is the gyromagnetic ratio (for free protons, for example H2O protons, $\gamma/2\cdot\pi = 42.576$ MHz/T). After an excitation period, the high-frequency generator 25 is switched off by the central control means 45. The resonant excitation is always performed at the beginning of each measurement cycle. For some methods of operation, r.f. pulses are also induced in the body during the measurement cycle. These r.f. pulses are then, for example a series composed of 180° r.f. pulses which are periodically generated. The latter is referred to as "spin echo". Spin echo is inter alia described in the article by I. L. Pykett "NMR in Medicine", published in Scientific American, May 1982.

During the next step signal samples are collected. For this purpose use can be made of the gradient fields which are generated by the generators 19, 21 and 23, respectively, under the control of the central control means 45. The detection of the resonance signal (referred to as the FID signal) is performed by switching on the high frequency detector 27, the demodulator 22, the sampling circuit 29, the analog-to-digital converter 31, and the control unit 37. This FID signal appears as a result of the precessional motion of the resultant nuclear magnetizations about the field direction of the magnetic field $\bar{B}_o$ which is caused by the r.f. excitation pulse. This nuclear magnetization induces an induction voltage in the detection coil whose amplitude is a measure of the resultant nuclear magnetization.

The analog, sampled FID signals originating from the sampling circuit 29 are digitized (converter 31) and stored in a memory 33. After a final signal sample has been taken at an instant $t_e$, the central control means 45 deactivate the generators 19, 21 and 23, the sampling circuit 29, the control unit 37 and the analog-to-digital converter 31.

The sampled FID signal is and remains stored in the memory 33. Subsequently, a next measurement cycle is performed during which an FID signal is again generated, sampled and stored in the memory 33. When a sufficient number of FID signals have been measured (the number of FID signals to be measured depends, for example on the desired resolution), an image is formed by means of a 2-D or 3-D Fourier transformation (this depends on the use of the gradient magnetic fields under whose effects the FID signals are generated and sampled).

FIG. 3a shows an example of a measurement cycle in accordance with the present state of the art which will be illustrated also with reference to the device 15 shown in FIG. 2. Using the high-frequency coil 11, a 90° pulse $P_1$ is generated after the energizing of the main coils 1 which generate a steady, homogeneous magnetic field Bo. The resonance signal F1 which results is allowed to decay when using the spin echo technique and, after a period of time $t_{v1}$, a 180° pulse $P_2$ is generated by the high-frequency coil 11. During a part of the period $t_{v1}$, gradient fields $G_x$ and $G_y$ are generated, denoted by curves $G_1$ and $G_3$, for reasons to be described hereinafter. After a period of time $t_{v2}$ which is equal to $t_{v1}$, an echo resonance signal $F_2$ produced by the 180° pulse $P_2$ will reach a peak value. The use of the so-called spin echo technique (180° pulse $P_2$) prevents the occurrence of phase errors in the resonance signals produced by spin nuclei; such phase errors are caused by inhomogeneities in the steady magnetic field Bo. The echo resonance signal is sampled each time after a sampling interval $t_m$ in the presence of a gradient magnetic field $G_x$ which is denoted by a curve $G_2$.

It is known that the phase angle of a magnetization at a point x in a gradient magnetic field $G_x$ is determined by $$\int^t \gamma \cdot G_x \cdot x \cdot d\tau.$$

Thus an image frequency $k_x$ can be defined as:

$$k_x = \gamma \cdot \int^t G_x \cdot d\tau.$$

Thus, after each sampling period $t_m$ a respective signal sample is determined which is associated with a corresponding (different) image frequency $k_x$. The successive image frequencies exhibit an image frequency difference $$\Delta k_x = \gamma \cdot \int_{t_m} G_x \cdot d\tau.$$

It will be apparent that when the described measurement cycle is repeated during which a gradient field $G_y$ is applied for some time before sampling takes place, signal samples are obtained which are associated with image frequency pairs ($k_x$, $k_y$). In the absence of a gradient magnetic field $G_y$, signal samples are thus obtained which are associated with the image frequencies ($k_x$, O). It can be demonstrated that, when a group of signal samples are collected which are associated with a matrix of image frequency pairs, $k_x$, $k_y$ in which the image frequencies range from $-k_{xm}$ to $+k_{xm}$ and from $-k_{ym}$ to $+k_{ym}$, the distribution of the magnetization can be determined in an x-y plane from this group of signal samples by means of a 2-D Fourier transformation, $|k_{xm}|$ and $|k_{ym}|$ being the highest image frequencies occurring in the matrix. Consequently, for the determination of a nuclear magnetization distribution it is necessary to extract signal samples which are associated with image frequencies between $-k_{xm}$ and $+k_{xm}$, and between $-k_{ym}$ and $+k_{ym}$. The image frequency $k_y$ is determined by:

$$k_y = \gamma \int_{t_{v1}} G_3(\tau) \cdot d\tau,$$

so that it has a constant value during a measurement cycle. The image frequency $k_x$ is determined by the gradient fields $G_1$ and $G_2$, the intensities and durations of these fields being adapted to one another so that at the instant $t_o$ the signal sample associated with the image frequency pair (O, $k_y$) is extracted. The foregoing implies that:

$$\int_{t_{v1}} \gamma \cdot G_1(\tau) \cdot d\tau = \int_{t_{v2}} \gamma \cdot G_2(\tau) \cdot d\tau.$$

When $$\int_{t_{v1}} \gamma \cdot G_1(\tau) \cdot d\tau$$

is adjusted so that the integral equal $+k_{xm}$, the first signal sample extracted at the instant $t=t_s$ will be associated with the image frequency pair ($-k_{xm}$, $k_y$). After expiration of a period of time T of the measurement cycle started by the pulse $P_1$, a next measurement cycle is started by a similar measurement pulse $P'_1$ in order to take a new series of signal samples which are associated with image frequency pairs ($k_x$, $k_y$), $k_x$ being variable and $k_y$ being constant during said measurement cycle and predetermined in that during the period $t_{v1}'$ between the pulses $P'_1$ and $P'_2$ a gradient field $G'_1$ and a gradient field $G'_3$ ($G'_3$ having a different intensity for each measuring cycle) are applied. The duration of the time period T between the beginning of two measurement cycles amounts to from 0.5 to 1 s in the methods according to the present state of the art. A further reduction of this time period will be at the expense of the nuclear spin echo signal generated during the next measurement cycle, because a substantial part of the excited nuclear spins will have a comparatively long relaxation time with respect to this shorter period of time. Only that proportion of the nuclear spins which have relaxed back into the direction of the main field Bo will then make a contribution to the next spin echo signal.

If no gradient field is present during the measurement period, as shown in FIG. 3b (all pulses in FIG. 3b which are also shown in FIG. 3a are denoted by corresponding reference numerals), signal samples will be taken which are a function of $k_x$, $k_y$ and the period t. Using the measurement cycle shown in FIG. 3b, one row after the other of a three-dimensional matrix ($k_x$, $k_y$, t) is filled, a 3-D matrix containing data (x, y, f) being derived therefrom after a 3-D Fourier transformation: an (x, y) location-dependent frequency spectrum (f).

The period of time required for the execution of the methods shown in the FIGS. 3a and b can be substantially reduced as will be explained with reference to FIGS. 4 and 5.

FIG. 4 illustrates a measurement cycle of a method in accordance with the invention. This measurement cycle is actually identical to one of the measurement cycles shown in the FIGS. 3a and b. For the sake of clarity, FIG. 4 does not show gradient fields and only the relevant nuclear spin echo signals. However, in the method in accordance with the invention the high-frequency 180° pulse $P_3$ is generated a period of time $t_2$ after the instant of echo of the generated nuclear spin echo signal $F_2$. During the nuclear spin echo signal $F_3$ thus generated, a further high-frequency excitation pulse $P_4$ is generated. The centre of gravity of the (gaussian pulse-shaped) high-frequency excitation pulse $P_4$ preferably coincides with the instant of echo of the echo signal $F_3$. The pulses $P_3$ and $P_4$ serve the following purpose. The 180° pulse $P_3$ puts the components of the nuclear magnetizations which are directed transversely with respect to the main field Bo in phase (at the instant of echo), provided that the phase differences caused by the gradient fields and other (deliberately introduced) field inhomogeneities are compensated for. Consequently, the direction of these components of the magnetizations can be changed in a simple manner by the further high-frequency excitation pulse $P_4$. The phase of the high-frequency excitation pulse $P_4$ with respect to the resultant phase of the nuclear magnetizations at the instant of echo determines the directional variation of the components of the nuclear magnetization which are now in phase. When the phase of the (selective) electromagnetic pulse $P_1$ is assumed to be 0°, and this pulse $P_1$ is defined as an x pulse, a high-frequency 180° pulse $P_2$ will generally be an x pulse or an −x pulse (in phase or in phase opposition with $P_1$) or an y pulse or a −y pulse. However, pulses having a different phase can also be used.

If the high-frequency 180° pulse $P_2$ is an x pulse, preferably a second echo signal $F_3$ is generated with a −x 180° pulse $P_3$. Possible effects of inhomogeneities of the high-frequency field and of the steady magnetic field Bo, which affect the intensity and the phase of the first nuclear spin echo signal $F_2$, are thus compensated for. The two successive nuclear spin echo signals $F_2$ and $F_3$ then have, for example a −y phase and a +y phase, respectively, in this pulse cycle $P_1$-$P_2$-$P_3$. During the second nuclear spin echo signal $F_3$, a further high-frequency 90° (selective) excitation pulse $P_4$ is generated. The phase of this pulse $P_4$ determines the directional variations to which the nuclear magnetizations will be subjected. If the pulse $P_4$ is a −x pulse, any transverse components of the nuclear magnetizations will be rotated so as to lie in the direction (positive z-axis) of the steady magnetic field Bo. In the case of a +x pulse, said transverse components will be rotated so as to lie in the opposite direction (negative z-axis) to that of the magnetic field Bo. It may be stated in general that the phase of the further high-frequency excitation pulse will either lead or lag the resultant phase of the nuclear magnetization by 90° at the instant of echo. The further excitation pulse $P_4$ thus rotates the transverse components into the equilibrium position or against the direction of the steady magnetic field Bo. When more than one nuclear spin echo signal is generated and/or use is made of an excitation pulse having a different phase at the start of a measurement cycle, the phase required by the further high-frequency excitation signal for rotating the transverse components of the magnetization into the direction of or into the direction opposite to that of the magnetic field Bo can be deduced in a simple manner. The ultimate result will depend on the pulse sequences used during the measurement cycle and on the relaxation times $T_1$ and $T_2$ of the object under examination. When a measurement cycle as shown in FIG. 4 is performed, the duration $T_1$ of this measurement cycle amounts to 200 ms. After the (selective) excitation pulse $P_1$ (+x 90° pulse) there is applied, after $t_{v1}$ (=25 ms), a +x, 180° pulse $P_2$, after which an echo signal $F_2$ occurs which is sampled. The pulse $P_3$ is a −x 180° pulse which succeeds $P_2$ after 50 ms, so that the further high-frequency excitation pulse $P_4$ should follow after 25 ms. This pulse $P_4$ (+x, 90° pulse) is followed by a waiting period of 100 ms, so that the overall duration of the measurement cycle is approximately 200 ms; this is substantially shorter than the duration T of from 500 ms to 1 second of a measurement cycle according to the present state of the art (FIGS. 3a and b). It can be calculated that after the generation of a regular, complete series of nuclear spin echo signals, the signal intensity $S_1$ at the instant of echo (in the dynamic steady state) equals:

$$S_1 = k \cdot m_o \cdot \frac{[1 - \exp(-t_4/T_1)] \cdot \exp(-2t_1/T_2)}{1 - \exp[-(t_1 + t_2 + t_3)/T_2] \cdot \exp(-t_4/T_1)}$$

in which $M_o$ is the induced nuclear magnetization in thermal equilibrium and k represents the instrument parameters. For $t_i << T_1$, $T_2$ and also for $t_i << T_1$, $T_2$, in which i=1, 2, 3 or 4: $S_1 \approx k \cdot M_o \exp(-2t_1/T_2)$, which is the signal strength occurring upon full relaxation to thermal equilibrium. If no further high-frequency excitation pulse is used, this will occur only for $t_i >> T_1$, $T_2$. It will be apparent that when the further excitation pulses are used, the image will not be exactly the same as in the case of a complete relaxation of the magnetizations; however, it has been found in practice that the waiting period between the successive samples can be substantially reduced without giving rise to a significant signal loss so that an image can be provided which is rich in information concerning the distribution of nuclear magnetization.

FIG. 5 shows a preferred version of a method in accordance with the invention. The measurement cycle of this method actually comprises two cycles which have the same pulse sequence but in which some of the time intervals between the pulses in the two cycles are different. In the present example the high-frequency 90° and 180° pulses in the first and the second cycle correspond to the 90° and 180° pulses of FIG. 4. The time intervals $t'_{v1}$, $t'_{v2}$, $t'_2$, $t'_3$ also correspond to $t_{v1}$, $t_{v2}$, $t_2$, $t_3$, respectively. The time interval $t'_4$ is longer than the time interval $t_4$. From the stationary solution of the Bloch equations it can be deduced that negative signals can occur in the nuclear spin echo signal formed in the second cycle, thus giving rise to changes in contrast (different intensity distributions) in the NMR image to be reconstructed of the object to be displayed. Besides the described reduction of the measurement time (the periods T1 and T11 should be chosen so that together they are shorter than the measurement period T in FIG. 3a or 3b) it is thus also possible to reproduce other information in an NMR image; this information will depend on the time intervals used in the successive cycles.

It is also to be noted that 90° and 180° excitation pulses are used in the described examples. Evidently, other pulse angles may also be used at the beginning ($P_1$, $P'_1$) of a cycle as well as for the further high-frequency pulse ($P_4$, $P'_4$) at the end of the measurement cycle (with or without selective excitation).

For the selection/adjustment of a given pulse sequence and the associated time intervals for a measurement cycle, use is preferably made of preprogrammed computer means. In one embodiment of the device 15 (FIG. 2), the central control means 45 comprise a preprogrammed computer 51 with an input/output work station 52 for control data and a pulse program generator 53 (see FIG. 6). Outputs 55 of the pulse program generator 53 are connected, via the bus 50 (see FIG. 2) to the current generators 19, 21, 23 and 25 to be controlled by the generator 53 for the coils 3a, b, 5, 7 and 11. It will be apparent that the outputs 55 can also be directly connected to said generators. The computer (Philips type P857) is programmed in accordance with the program which is given hereinafter in the appendix; on the basis of this program it controls the pulse program generator 53 (Nicolet type 293B) by means of the program and control data to be input via the work station 52. The set of instructions used in the program (third column in the program) is the instruction set of the pulse program generator 53 (with the exception of the instruction: JSA, which results in a jump to the start address). Each entry in the fourth column defines a period of time during which the output signals should be present at the outputs of the generator 53. The fourth column of the program indicates the state of the outputs of the generator 53 in a hexadecimal code (with the exception of the letter S). The fifth column states an address or memory location. The symbol I in the sixth column indicates the presence of an interrupt which can fetch additional functions in conjunction with a part of a code to be output on the outputs 55 of the generator, for example: (a) load the generator 25 with a new waveform (for 180° pulse instead of 90° pulse), (b) reverse the phase of an excitation pulse, or (c) indication of the beginning of a new pulse sequence. The program given in the appendix utilizes exclusively + or −y pulses for the 90° excitation pulses and exclusively + or −x pulses for the 180° pulses.

Even though the determination of nuclear spin resonance spectra has been described with reference to FIG. 3b subject to the condition that no steady gradient magnetic field is present during the measurement period, such a determination where signal samples are extracted in the presence of a gradient magnetic field during the measurement period is quite feasible. If the application of any gradient field is postponed after the excitation by a dephasing delay $\tau x$ (for example, during the preparation period), after which two gradient fields are applied in order to extract signal samples in the presence of a third gradient field, a 4-D matrix ($k_x$, $k_y$, $k_z$, t) can also be filled with signal samples, provided that the said dephasing delay $\tau x$ differs for each measurement cycle. After 4-D Fourier transformation, the desired spectrum is then found again as a function of x, y, z.

For the described examples, the nuclear magnetization distributions have each time been determined via Fourier transformation (Fourier zeugmatography). It is to be noted that the methods in accordance with the invention also cover the methods based on the so-called projection reconstruction methods such as described in Philips Technisch Tijdschrift, 41, No. 3, 1983, pages 73–89.

```
0   PP0027 : NAME OF PULSE PROGRAM
1   831006 : VERSION DATE OF PULSE PROGRAM
2   100    : DWELLTIME IN MICRO-SECONDS. (=4 * D11)
3
4   THIS PULSE PROGRAM HEADER CONTAINS THE CODED DESCRIPTION OF 4 RF PULSE
5   SEQUENCES.THE FIRST THREE ARE TO BE USED FOR NMR IMAGING USING DRIVEN
6   EQUILIBRIUM TECHNIQUES.THE LAST ONE IS FOR COMPARISON PURPOSES AND
7   MAKES NO USE OF DRIVEN EQUILIBRIUM TECHNIQUES.THIS LAST RF PULSE
8   SEQUENCE IS COMMONLY KNOWN AS SATURATION RECOVERY RF PULSE SEQUENCE.
9   ONE CAN CHOOSE FROM ONE OF THE FOLLOWING RF PULSE SEQUENCES :
10
11      (0) TZP RF PULSE SEQUENCE :
12
13          P(90) - TAU - P(180) - 2*TAU - P(180) - TAU - P(RESET) - (D0 + 44
14
15      (1) VZP RF PULSE SEQUENCE :
16
17          P(90) - TAU - P(180) - 2*TAU - P(180) - TAU - P(RESET) - P(180) -
18          (D0 + 44)
19
20      (2) VZP-VZP RF PULSE SEQUENCE :
21
22          P(90) - TAU - P(180) - 2*TAU - P(180) - TAU - P(RESET) - P(180) -
23          (D10 + 44) - P(90) - TAU - P(180) - 2*TAU - P(180) - TAU -
24          P(RESET) - P(180) - (D0 + 44)
25
```

(3) SATURATION RECOVERY RF PULSE SEQUENCE :

P(90) - TAU - P(180) - 2*TAU - P(180) - TAU - (D0 + 44)

O     : START ADDRESS OF PULSE PROGRAM
        = 0 FOR TZP (RESET CYCLE), SEQ.TIME = 144 + D0 MS.
        = 1 FOR VZP (SET CYCLE), SEQ.TIME = 144 + D0 MS.
        = 2 FOR VZP-VZP (2 * SET CYCLE), SEQ.TIME = 288 + D0 + D10 MS.
        = 3 FOR SATURATION RECOVERY, SEQ.TIME = 144 + D0 MS.
*****************************************************************
COUNTER VALUES :

256                         ; C1 = NUMBER OF TIME-SAMPLES IN ECHO
END                         ;
*****************************************************************
DURATION VALUES : (D0,D1,D2,............,D14)

256M                        ; D0  = T(P(90)) - T(P((RE)SET)) - 44 MSEC.
3M,9M,1M                    ; DURATIONS 1,2 AND 3
10M,6M                      ; DURATIONS 4 AND 5
7M,1M,1.2M,8M               ; DURATIONS 6,7,8 AND 9
56M                         ; D10 = T(P(90)) - T(P((RE)SET)) - 44 MSEC.
25U,19.53U                  ; DURATIONS 11,12   D12 = .5 * D4/C1
3M,2M                       ; DURATIONS 13,14
END                         ;
*****************************************************************
PULSE MENUES :

0 JUC D2  S8900E 7      I ; START FOR TZP , RESET WAVEFORM GENERATOR
  1 JUC D2  S8900E 50     I ; START FOR VZP ,             ,,
  2 JUC D2  S8900E 94     I ; START FOR VZP-VZP ,          ,,
  3 JUC D2  S8900E 136    I ; START FOR RHO-T2 ,           ,,
  4 JUC D2  S8900E 178    I ; START ADJUSTMENT VZP/TZP CYCLE , ,,

7 NOP D1  S00E0E          ; START/STOP GRADIENTS
  8 NOP D13 S0000E          ;
  9 NOP D1  S00E0E          ; START/STOP GRADIENTS
 10 NOP D1  S0000E          ;
 11 NOP D7  S00E0E          ; START/STOP GRADIENTS
 12 NOP D3  S0000E          ;
 13 NOP D4  S0013E          ; 90 DEGREES +/-Y RF PULSE
 14 NOP D1  S00E0E          ; START/STOP GRADIENTS
 15 NOP D3  S0000E          ;
 16 NOP D7  S00E0E          ; START/STOP GRADIENTS
 17 NOP D6  S5000E        I ; PHASE ALTERNATE Y
 18 NOP D1  S00E0E          ; START/STOP GRADIENTS
 19 NOP D3  S0000E          ;
 20 NOP D7  S00E0E          ; START/STOP GRADIENTS
 21 LD1 D5  S00F8E C1       ; 180 DEGREES +X RF PULSE , LOAD LOOP COUNTER
 22 NOP D1  S02E0A          ; START/STOP GRADIENTS
 23 NOP D8  S0200A          ;
 24 NOP D1  S02E0A          ; START/STOP GRADIENTS
 25 NOP D3  S02000          ;
 26 JUC D7  S02E00 29       ; START/STOP GRADIENTS
 27 NOP D11 S00000          ; NS * TDWELL LOOP
 28 IJ1 D11 S00000 31       ;
 29 NOP D11 S00001          ; ADC SAMPLE PULSE
 30 JUC D11 S00001 27       ;
 31 NOP D1  S00E0E          ; START/STOP GRADIENTS
 32 NOP D8  S0000E          ;
 33 NOP D1  S00E0E          ; START/STOP GRADIENTS
 34 NOP D3  S0000E          ;
 35 NOP D7  S00E0E          ; START/STOP GRADIENTS
 36 NOP D5  S00F8E          ; 180 DEGREES +X RF PULSE
 37 NOP D1  S00E0E          ; START/STOP GRADIENTS
 38 NOP D9  S0000E          ;
 39 NOP D1  S00E0E          ; START/STOP GRADIENTS
 40 NOP D3  S0000E          ;
```

```
94    41 NOP D14 S00E0E        ; START/STOP GRADIENTS
95    42 NOP D4  S00F3E        ; 90 DEGREES TZP (RESET PULSE)
96    43 NOP D1  S00E0E        ; START/STOP GRADIENTS
97    44 NOP D3  S0000E        ;
98    45 NOP D7  S00E0E        ; START/STOP GRADIENTS
99    46 NOP D5  S0000E        ; NO RF PULSE
100   47 JSA D0  S0000E      I ; RECYCLE
101
102   50 NOP D1  S00E0E        ; START/STOP GRADIENTS
103   51 NOP D13 S0000E        ;
104   52 NOP D1  S00E0E        ; START/STOP GRADIENTS
105   53 NOP D1  S0000E        ;
106   54 NOP D7  S00E0E        ; START/STOP GRADIENTS
107   55 NOP D3  S0000E        ;
108   56 NOP D4  S0013E        ; 90 DEGREES +/-Y RF PULSE
109   57 NOP D1  S00E0E        ; START/STOP GRADIENTS
110   58 NOP D3  S0000E        ;
111   59 NOP D7  S00E0E        ; START/STOP GRADIENTS
112   60 NOP D6  S5000E      I ; PHASE ALTERNATE Y
113   61 NOP D1  S00E0E        ; START/STOP GRADIENTS
114   62 NOP D3  S0000E        ;
115   63 NOP D7  S00E0E        ; START/STOP GRADIENTS
116   64 LD1 D5  S00F8E    C1  ; 180 DEGREES +X RF PULSE , LOAD LOOP COUNTER
117   65 NOP D1  S02E0A        ; START/STOP GRADIENTS
118   66 NOP D8  S0200A        ;
119   67 NOP D1  S02E0A        ; START/STOP GRADIENTS
120   68 NOP D3  S02000        ;
121   69 JUC D7  S02E00    72  ; START/STOP GRADIENTS
122   70 NOP D11 S00000        ; NS * TDWELL LOOP
123   71 IJ1 D11 S00000    74  ;
124   72 NOP D11 S00001        ; ADC SAMPLE PULSE
125   73 JUC D11 S00001    70  ;
126   74 NOP D1  S00E0E        ; START/STOP GRADIENTS
127   75 NOP D8  S0000E        ;
128   76 NOP D1  S00E0E        ; START/STOP GRADIENTS
129   77 NOP D3  S0000E        ;
130   78 NOP D7  S00E0E        ; START/STOP GRADIENTS
131   79 NOP D5  S00F8E        ; 180 DEGREES +X RF PULSE
132   80 NOP D1  S00E0E        ; START/STOP GRADIENTS
133   81 NOP D9  S0000E        ;
134   82 NOP D1  S00E0E        ; START/STOP GRADIENTS
135   83 NOP D3  S0000E        ;
136   84 NOP D14 S00E0E        ; START/STOP GRADIENTS
137   85 NOP D4  S00F3E        ; 90 DEGREES TZP (RESET PULSE)
138   86 NOP D1  S00E0E        ; START/STOP GRADIENTS
139   87 NOP D3  S0000E        ;
140   88 NOP D7  S00E0E        ; START/STOP GRADIENTS
141   89 NOP D5  S0018E        ; 180 DEGREES +X PULSE
142   90 JSA D0  S0000E      I ; RECYCLE
143
144   94 NOP D1  S00E0E        ; START/STOP GRADIENTS
145   95 NOP D13 S0000E        ;
146   96 NOP D1  S00E0E        ; START/STOP GRADIENTS
147   97 NOP D1  S0000E        ;
148   98 NOP D7  S00E0E        ; START/STOP GRADIENTS
149   99 NOP D3  S0000E        ;
150  100 NOP D4  S0013E        ; 90 DEGREES +/-Y RF PULSE
151  101 NOP D1  S00E0E        ; START/STOP GRADIENTS
152  102 NOP D3  S0000E        ;
153  103 NOP D7  S00E0E        ; START/STOP GRADIENTS
154  104 NOP D6  S5000E      I ; PHASE ALTERNATE Y
155  105 NOP D1  S00E0E        ; START/STOP GRADIENTS
156  106 NOP D3  S0000E        ;
157  107 NOP D7  S00E0E        ; START/STOP GRADIENTS
158  108 LD1 D5  S00F8E    C1  ; 180 DEGREES +X RF PULSE , LOAD LOOP COUNTER
159  109 NOP D1  S02E0A        ; START/STOP GRADIENTS
160  110 NOP D8  S0200A        ;
161  111 NOP D1  S02E0A        ; START/STOP GRADIENTS
162  112 NOP D3  S02000        ;
```

```
163  113 JUC  D7   S02E00  116      ; START/STOP GRADIENTS
164  114 NOP  D11  S00000           ; NS * TDWELL LOOP
165  115 IJ1  D11  S00000  118      ;
166  116 NOP  D11  S00001           ; ADC SAMPLE PULSE
167  117 JUC  D11  S00001  114      ;
168  118 NOP  D1   S00E0E           ; START/STOP GRADIENTS
169  119 NOP  D8   S0000E           ;
170  120 NOP  D1   S00E0E           ; START/STOP GRADIENTS
171  121 NOP  D3   S0000E           ;
172  122 NOP  D7   S00E0E           ; START/STOP GRADIENTS
173  123 NOP  D5   S00F8E           ; 180 DEGREES +X RF PULSE
174  124 NOP  D1   S00E0E           ; START/STOP GRADIENTS
175  125 NOP  D9   S0000E           ;
176  126 NOP  D1   S00E0E           ; START/STOP GRADIENTS
177  127 NOP  D3   S0000E           ;
178  128 NOP  D14  S00E0E           ; START/STOP GRADIENTS
179  129 NOP  D4   S00F3E           ; 90 DEGREES TZP (RESET PULSE)
180  130 NOP  D1   S00E0E           ; START/STOP GRADIENTS
181  131 NOP  D3   S0000E           ;
182  132 NOP  D7   S00E0E           ; START/STOP GRADIENTS
183  133 NOP  D5   S5018E         I ; 180 DEGREES +X PULSE , PHASE ALTERNATE Y
184  134 JUC  D10  S0000E  1        ; GOTO VZP CYCLE
185
186  136 NOP  D1   S00E0E           ; START/STOP GRADIENTS
187  137 NOP  D13  S0000E           ;
188  138 NOP  D1   S00E0E           ; START/STOP GRADIENTS
189  139 NOP  D1   S0000E           ;
190  140 NOP  D7   S00E0E           ; START/STOP GRADIENTS
191  141 NOP  D3   S0000E           ;
192  142 NOP  D4   S0013E           ; 90 DEGREES +/-Y RF PULSE
193  143 NOP  D1   S00E0E           ; START/STOP GRADIENTS
194  144 NOP  D3   S0000E           ;
195  145 NOP  D7   S00E0E           ; START/STOP GRADIENTS
196  146 NOP  D6   S5000E         I ; PHASE ALTERNATE Y
197  147 NOP  D1   S00E0E           ; START/STOP GRADIENTS
198  148 NOP  D3   S0000E           ;
199  149 NOP  D7   S00E0E           ; START/STOP GRADIENTS
200  150 LD1  D5   S00F8E  C1       ; 180 DEGREES +X RF PULSE , LOAD LOOP COUNTER
201  151 NOP  D1   S02E0A           ; START/STOP GRADIENTS
202  152 NOP  D8   S0200A           ;
203  153 NOP  D1   S02E0A           ; START/STOP GRADIENTS
204  154 NOP  D3   S02000           ;
205  155 JUC  D7   S02E00  158      ; START/STOP GRADIENTS
206  156 NOP  D11  S00000           ; NS * TDWELL LOOP
207  157 IJ1  D11  S00000  160      ;
208  158 NOP  D11  S00001           ; ADC SAMPLE PULSE
209  159 JUC  D11  S00001  156      ;
210  160 NOP  D1   S00E0E           ; START/STOP GRADIENTS
211  161 NOP  D8   S0000E           ;
212  162 NOP  D1   S00E0E           ; START/STOP GRADIENTS
213  163 NOP  D3   S0000E           ;
214  164 NOP  D7   S00E0E           ; START/STOP GRADIENTS
215  165 NOP  D5   S00F8E           ; 180 DEGREES +X RF PULSE
216  166 NOP  D1   S00E0E           ; START/STOP GRADIENTS
217  167 NOP  D9   S0000E           ;
218  168 NOP  D1   S00E0E           ; START/STOP GRADIENTS
219  169 NOP  D3   S0000E           ;
220  170 NOP  D14  S00E0E           ; START/STOP GRADIENTS
221  171 NOP  D4   S00F0E           ; NO RF PULSE
222  172 NOP  D1   S00E0E           ; START/STOP GRADIENTS
223  173 NOP  D3   S0000E           ;
224  174 NOP  D7   S00E0E           ; START/STOP GRADIENTS
225  175 NOP  D5   S0000E           ; NO RF PULSE
226  176 JSA  D0   S0000E         I ; RECYCLE
227
228  178 NOP  D1   S00E0E           ; START/STOP GRADIENTS
229  179 NOP  D13  S0000E           ;
```

```
230  180 NOP  D1   S00E0E       ; START/STOP GRADIENTS
231  181 NOP  D1   S0000E       ;
232  182 NOP  D7   S00E0E       ; START/STOP GRADIENTS
233  183 NOP  D3   S0000E       ;
234  184 NOP  D4   S0013E       ; 90 DEGREES +/-Y RF PULSE
235  185 NOP  D1   S00E0E       ; START/STOP GRADIENTS
236  186 NOP  D3   S0000E       ;
     187 NOP  D7   S00E0E       ; START/STOP GRADIENTS
238  188 NOP  D6   S5000E    I  ; PHASE ALTERNATELY
239  189 NOP  D1   S00E0E       ; START/STOP GRADIENTS
240  190 NOP  D3   S0000E       ;
241  191 NOP  D7   S00E0E       ; START/STOP GRADIENTS
242  192 LD1  D5   S00F8E  C1   ; 180 DEGREES +X RF PULSE , LOAD LOOP COUNTER
243  193 NOP  D1   S02E0A       ; START/STOP GRADIENTS
244  194 NOP  D8   S0200A       ;
245  195 NOP  D1   S02E0A       ; START/STOP GRADIENTS
246  196 NOP  D3   S02002       ;
247  197 JUC  D7   S02E02  200  ; START/STOP GRADIENTS
248  198 NOP  D11  S00002       ; NS * TDWELL LOOP
249  199 IJ1  D11  S00002  202  ;
250  200 NOP  D11  S00002       ;
251  201 JUC  D11  S00002  198  ;
252  202 NOP  D1   S00E0E       ; START/STOP GRADIENTS
253  203 NOP  D8   S0000E       ;
254  204 NOP  D1   S00E0E       ; START/STOP GRADIENTS
255  205 NOP  D3   S0000E       ;
256  206 NOP  D7   S00E0E       ; START/STOP GRADIENTS
257  207 NOP  D5   S00F8E       ; 180 DEGREES +X RF PULSE
258  208 NOP  D1   S00E0E       ; START/STOP GRADIENTS
259  209 NOP  D9   S0000E       ;
260  210 NOP  D1   S00E0E       ; START/STOP GRADIENTS
261  211 NOP  D3   S0000E       ;
262  212 LD1  D7   S00E0A  C1   ; START/STOP GRADIENTS
263  213 JUC  D7   S00E08  215  ; START/STOP GRADIENTS
264  214 IJ1  D12  S00E00  216  ;
265  215 JUC  D12  S00E01  214  ; ADC SAMPLE PULSE
266  216 NOP  D1   S00E0E       ; START/STOP GRADIENTS
267  217 NOP  D3   S0000E       ;
268  218 NOP  D7   S00E0E       ; START/STOP GRADIENTS
269  219 JSA  D0   S0000E    I  ; RECYCLE
270
271  END                        ;
272
273  +       : FREE
274  *       : FREE
275  *       : FREE
276  *       : FREE
277  *       : FREE
278  *       : FREE
279  *       : FREE
280  *       : FREE
281  *       : FREE
282  *       : FREE
283  *       : FREE
284  *       : FREE
285  *       : FREE
286  *       : FREE
287  *       : FREE
288  *       : FREE
289  *       : FREE
```

What is claimed is:

1. A method of determining a nuclear magnetic distribution in a region of a body comprising the steps of:

generating a steady, homogeneous magnetic field in said region, generating a first high-frequency electromagnetic pulse so as to cause a precessional motion of the magnetization of nuclei in the body to thereby generate a resonance signal, extracting a plurality of signal samples from said resonance signal during a measurement period which is divided into a plurality of sampling intervals, generating a high-frequency 180° pulse so as to produce a nuclear spin echo signal, generating a further high-frequency excitation pulse during said echo signal, and thereafter repeating said first pulse generating and said signal sample extracting steps so as to obtain a group of said signal samples from which an image of the distribution of the induced nuclear magnetization is determined.

2. A method as claimed in claim 1 including the step of producing, in said region, at least one gradient magnetic field during a preparation period which follows said first pulse generating step and precedes said extracting step.

3. A method as claimed in claim 2 wherein said at least one gradient field produced during said producing step is such that the integral over the intensity during said preparation period has a different value each time said electromagnetic pulse generating and extracting steps are repeated, and deriving a location-dependent nuclear spin resonance spectra from said group of signal samples after Fourier transformation thereof.

4. A method as claimed in claim 1 including the steps of producing a first gradient magnetic field in said region during a preparation period which follows said first pulse generating step and precedes said extracting step, applying to said region a further gradient field having a gradient direction which extends perpendicularly to the gradient direction of said first gradient field, the integral over the intensity of said first gradient field during said preparation period having a different value each time said electromagnetic pulse generating and extracting steps are repeated, and deriving a nuclear spin density distribution from said group of signal samples after Fourier transformation thereof.

5. The method as claimed in claim 4 including producing a second gradient magnetic field in said region during said preparation period, said second field having a gradient direction which is perpendicular to the gradient directions of said first and further gradient fields.

6. A method as claimed in claim 1 or 2 wherein said further high-frequency excitation pulse is generated during the occurrence of the maximum value of the nuclear spin echo signal.

7. A method as claimed in claim 6, wherein the phase of the further high-frequency excitation pulse leads the resultant phase of the nuclear magnetization by 90° at the instant of echo.

8. A method as claimed in claim 6, wherein the phase of the further high-frequency excitation pulse lags the resultant phase of the nuclear magnetization by 90° at the instant of echo.

9. A method as claimed in claim 8, wherein the further high-frequency excitation pulse is a 90° selective excitation pulse.

10. A method as claimed in claim 7 wherein the further high-frequency excitation pulse is a 90° selective excitation pulse.

11. A method as claimed in claim 2, wherein after the further high-frequency excitation pulse, after a period of time T, a similar cycle of high-frequency pulses and associated gradient magnetic fields is completed, at least one pulse interval during the first cycle being different from a corresponding pulse interval during the second cycle.

12. A method as claimed in claim 3, wherein after generating of the first high-frequency electromagnetic pulse and before the gradient magnetic field is applied, a dephasing period is included having a different value during each measuring cycle comprised of said repetition of the first electromagnetic pulse generating and the extracting steps.

13. A method as claimed in claim 3, wherein the first high-frequency electromagnetic pulse is generated by applying a selective gradient magnetic field and either two or three gradient magnetic fields are applied during the preparation period, the gradient directions thereof being mutually perpendicular and, either by means of a three-dimensional or a four-dimensional Fourier transformation, location-dependent nuclear resonance spectra are obtained either in a slice or in a volume of a body.

14. A device for determining the nuclear magnetization distribution in a region of a body, comprising
 (a) first means for generating a steady homogeneous magnetic field,
 (b) second means for generating high-frequency electromagnetic radiation,
 (c) third means for generating a gradient magnetic field,
 (c) sampling means for sampling a resonance signal generated by said first and second generating means,
 (e) processing means for processing the signals provided by the sampling means in order to form a nuclear magnetization distribution, and
 (f) control means for controlling said first means, second means, third means, sampling means and said processing means, said control means comprising a preprogrammed computer means for generating and supplying control signals to the second means for generating high-frequency electromagnetic radiation so that, in response to said control signals said second means generates an adjustable pulse sequence of 90° and 180° excitation pulses such that the duration of a time interval between two 180° excitation pulses last generated is twice as long as the duration of the time interval between the last 180° pulse and a subsequent further 90° excitation pulse.

15. A method of determining a nuclear magnetic distribution in a region of a body comprising the steps of:
 generating a steady, homogeneous magnetic field in said region,
 generating at least one gradient magnetic field in said region,
 generating a first high-frequency electromagnetic pulse so as to cause a precessional motion of the magnetization of nulcei in the body to thereby generate a resonance signal,
 extracting a plurality of signal samples from said resonance signal during a measurement period which is divided into a plurality of sampling intervals,
 generating a high-frequency 180° pulse so as to produce a nuclear spin echo signal and to cancel a phase shift effect exerted on the nuclear magnetization by said gradient field,
 generating a further high-frequency excitation pulse during said echo signal, and
 thereafter repeating said gradient generating, said first pulse generating and said signal sample extracting steps so as to obtain a group of said signal samples from which an image of the distribution of the induced nuclear magnetization is determined.

* * * * *